US005566052A

United States Patent [19]
Hughes

[11] Patent Number: 5,566,052
[45] Date of Patent: Oct. 15, 1996

[54] ELECTRONIC DEVICES WITH ELECTROMAGNETIC RADIATION INTERFERENCE SHIELDS AND HEAT SINKS

[75] Inventor: Richard P. Hughes, Kanata, Canada

[73] Assignee: Northern Telecom Limited, Montreal, Canada

[21] Appl. No.: 487,771

[22] Filed: Jun. 8, 1995

[51] Int. Cl.[6] .................................................. H05K 7/20
[52] U.S. Cl. ..................... 361/704; 174/35 GC; 257/713; 361/719; 361/818
[58] Field of Search ................................ 174/16.3, 35 R, 174/35 GC; 361/702–704, 717–719, 816, 818; 165/80.3, 185; 257/713, 718, 719, 727

[56] References Cited

U.S. PATENT DOCUMENTS

| 4,621,304 | 11/1986 | Oogaki | 361/386 |
|---|---|---|---|
| 4,745,456 | 5/1988 | Clemens | 361/704 |
| 5,031,028 | 7/1991 | Galich | 357/81 |
| 5,132,875 | 7/1992 | Plesinger | 361/704 |
| 5,339,215 | 8/1994 | Nishiguchi | 361/704 |
| 5,365,410 | 11/1994 | Lonka | 361/816 |
| 5,463,529 | 10/1995 | Chia | 361/704 |

*Primary Examiner*—Gerald P. Tolin
*Attorney, Agent, or Firm*—R. J. Austin

[57] ABSTRACT

An electronic device with an EMI shield surrounding an electronic component on a substrate. A heat sink extends through an opening in the shield from heat conductive contact with the component to a position outside the shield. The heat sink operates also in an EMI shield capacity. The shield is stressed to hold the heat sink positively in heat conducting contact with the components. The shield preferably has cutting teeth which cut into the heat sink as the latter is passed into the aperture. With the inserted part of the heat sink being cylindrical, rotation of the heat sink causes the teeth to move up the inserted part to stress the shield and urge the heat sink against the component.

8 Claims, 3 Drawing Sheets

ELECTRONIC DEVICES WITH ELECTROMAGNETIC RADIATION INTERFERENCE SHIELDS AND HEAT SINKS

This invention relates to electronic devices with electromagnetic radiation interference shields and heat sinks.

It is well known in the electronic industry to provide substrate is, presumably in the form of printed circuit boards, which carry upon one or both sides, electronic components which provide various electronic functions. It is also known that electronic components generate heat and certain components also emit electromagnetic radiation which interferes with the operation of other components on a printed circuit board or with other electronic devices not mounted upon the board. A board mounted electronic component may be in the form of an integrated circuit or a chip. The tendency in modern design is for integrated circuits or chips to become smaller and faster in operation. A problem which exists with faster operation of smaller circuits is that they tend to increase in temperature and may overheat to such a degree that permanent damage may result unless steps are taken to avoid such situations. In this case heat removal becomes a prime necessity. However, heat removal considerations may be contradictory to the considerations necessary for overcoming electromagnetic emission problems. This is because for the avoidance of EMI emissions, a surrounding shield is normally necessary for an integrated circuit and this detracts from the removal of heat because such a shield tends to act as a heat insulator. In an attempt to avoid this particular problem it has been suggested to add heat sinks to the sides of electromagnetic shields in order to remove quickly heat transferred through the shields even though there is no direct contact between the component and the heat sink itself.

The present invention seeks to provide an electronic device comprising an electronic component carried upon a substrate in which the above disadvantages are avoided or minimized.

Accordingly, the present invention provides an electronic device comprising an electronic component carried upon one side of a substrate, and an electromagnetic radiation interference shield and heat sink assembly comprising: a resilient electromagnetic radiation shield extending around the electronic component on the one side of the substrate; and a heatsink extending outwards from the shield and passing through an aperture defined in the shield and into heat conductive relationship with the component with the heat sink occupying the hole to operate also in an electromagnetic radiation shielding capacity; the shield supporting the heat sink in an interference fit with the shield resiliently stressed to resiliently urge the heat sink positively into heat conducting relationship with the component.

As may be seen, with the electronic device of the invention, there is a coaction between the electromagnetic radiation shield and the heat sink. The shield is formed with an aperture which ordinarily would allow for emission of electromagnetic radiation. However, this aperture is occupied by the heat sink which thus prevents EMI from passing through the aperture. In addition, in locating the heat sink through the resilient shield, the shield is stressed and operates not only in its radiation shielding capacity, but also as a means for ensuring that the heat sink is held in heat conductive relationship with the component. As a result of this construction the heat sink is permitted to operate as effectively as is required normally for heat sink operation while also ensuring that the electromagnetic radiation interference shielding has its optimum requirements.

In a preferred arrangement, the shield is electrically in conductive contact with the heat sink so that the heat sink is grounded through the shield. Alternatively, where the electrically conductive contact is not provided or is not certain, then the shield itself may be grounded separately from the heat sink thereby enabling the heat sink to operate as an electromagnetic radiation interference shielding element.

Where the electrically conductive contact is provided between the shield and the heat sink the opposing surfaces of these two elements do, of course, provide a gas-tight seal between them in that actual metal-to-metal contact is obtained.

Preferably, the shield is provided with teeth extending around the aperture and the teeth cut into the heat sink which resiliently deflect the teeth and applies pressure to the heat sink to produce the electrically conductive contact with the component.

The invention also includes a heat sink and electromagnetic radiation interference shield combination for an electronic component mounted upon a substrate, the shield comprising a resilient electrically conductive housing for securing to the substrate, the housing defining an inner space for containing the component and formed with a generally circular aperture and a plurality of resilient cutting teeth disposed around and facing into the aperture, the cutting teeth having cutting edges inclined axially of the aperture; and the heat sink having a cylindrical end region receivable in an axial direction through the aperture in interference with the inclined cutting edges of the teeth so as to engage an end surface of the end region with the component, the heat sink then being rotatable within the aperture to cause the teeth to cut into the cylindrical end region thereby effecting resilient outwards movement of the teeth away from the component and hold the heat sink abutted in heat contacting engagement against the component.

One embodiment of the invention will now be described, by way of example, with reference to the accompanying drawings, in which.

Figure 1:
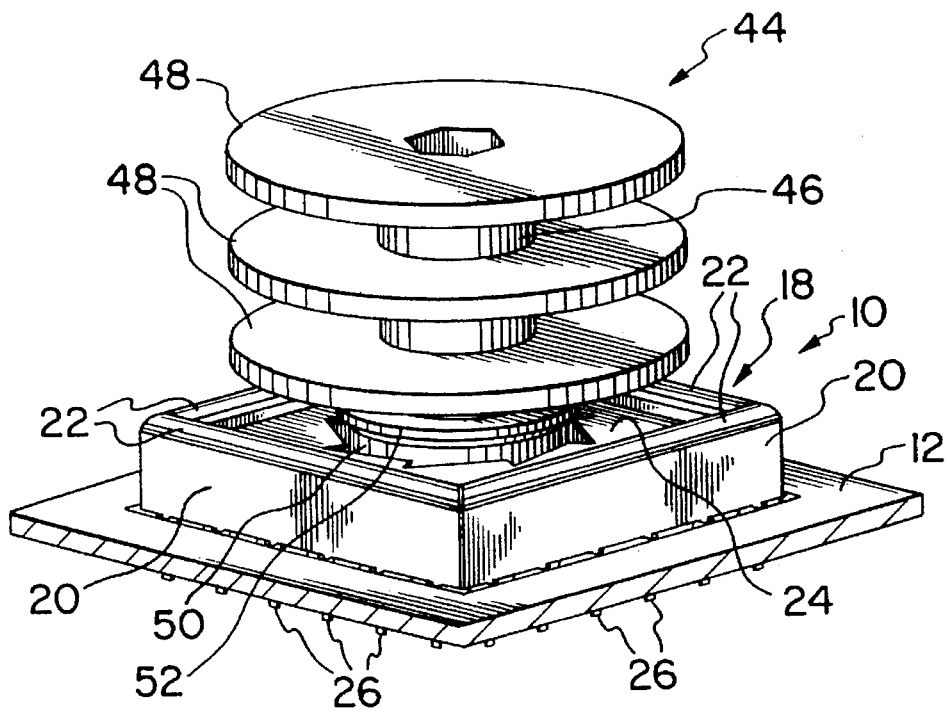
FIG. 1 is an isometric view of an electronic device according to the embodiment.
Figure 2:
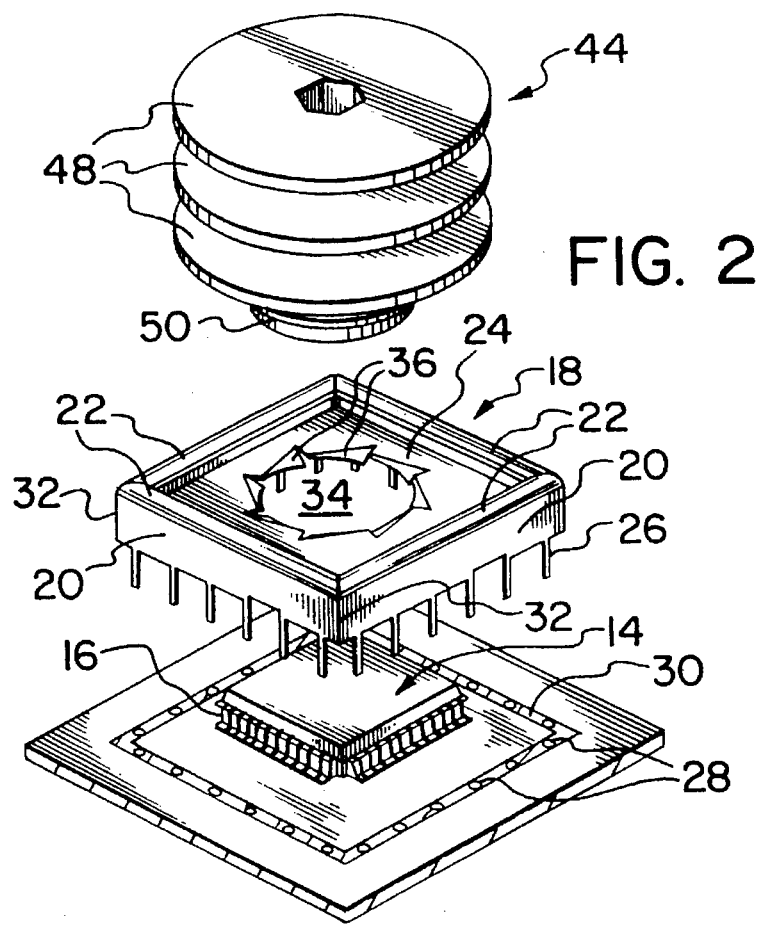
FIG. 2 is a view similar to FIG. 1 with the parts shown in exploded condition and to a smaller scale.
Figure 5:
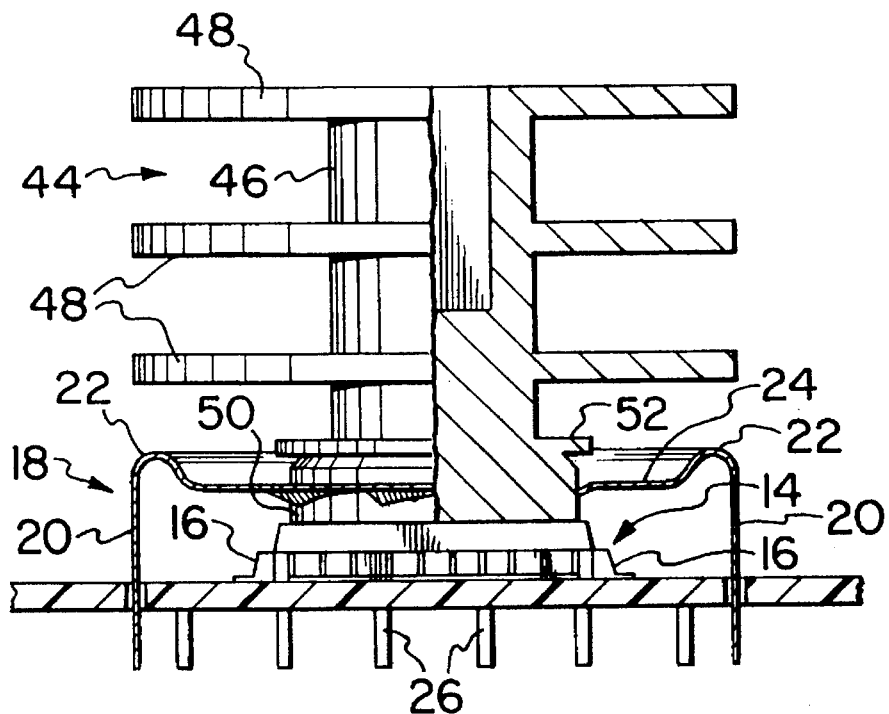
FIG. 5 is a cross-sectional view through the device to a larger scale and showing the device during one stage in its assembly.
Figure 6:
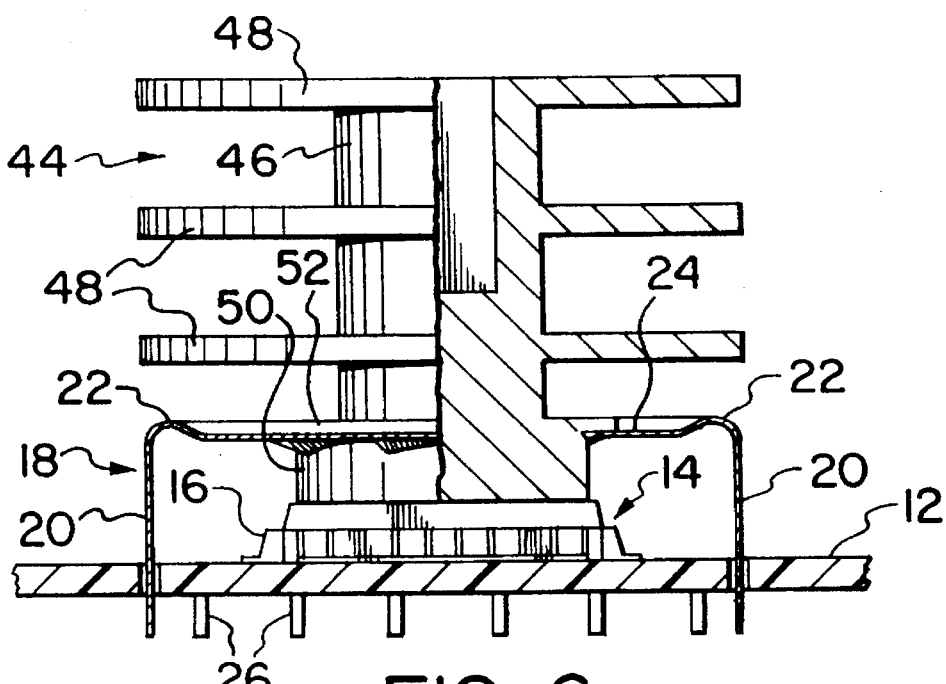
FIG. 6 is a view similar to FIG. 5 of the completed assembly.

As shown in FIG. 1, an electronic device 10 of the embodiment comprises a printed circuit board 12 having circuitry (not shown) and electronic components, one of which, component 14 is shown in FIGS. 2, 5 and 6. The component 14 is an integrated circuit component having terminal leads 16 extending downwardly from its circuitry, the terminal leads being connected to circuitry in the board 12 at terminal positions by soldering in well known manner and which will not be further described. The component 14 is of a type which generates heat during its usage and the heat generated is such that if it is not removed in a desired fashion then the stored heat of the component could render it unworkable. The component 14 is also of a type which emits electromagnetic radiation which could interfere with the operation of other components mounted on the board or with other electronic devices. As a result, it is required that the component 14 is provided both with an electromagnetic radiation interference shield (referred to hereinafter as an EMI shield) and also with a heat sink.

According to the present invention and as shown in this embodiment, the heat sink and the EMI shield is comprised of a unique assembly having the following construction. As may be seen particularly from FIG. 2, the EMI shield 18 is square in plan so as to fit around the square component 14. The shield 18 comprises four side walls 20 extending over at their tops as an inverted resiliently flexible U-bend 22 (FIGS. 5 and 6). The U-bend terminates in a substantially flat or top wall 24. Lower free ends of the side walls are provided with downward securing pins 26 and define an opening for a chamber for containing the component 14 when the shield 18 is secured to the printed circuit board by passage of the securing pins 26 into through holes 28 in the board and soldering the pins into the holes. For grounding purposes, the board is provided with an upper surface ground line 30 for electrical contact with the pins 26 and the free ends of the walls 20.

The shield 18 is formed of a single flat sheet of metal and, in shaping ends of the side walls 20 close substantially together at the corners 32. Material of the shield 18 is sufficiently resilient that the U-shaped bends 22 provide a degree of resilience to allow for resilient flexing movement between the top wall 24 and each of the side walls 20 for reasons to be described. The top wall 24 is formed with a central aperture 34 and is surrounded by a plurality of cutting teeth 36 extending into the aperture. As shown in greater detail in FIGS. 3 and 4, each of the teeth 36 has a cutting edge 38 which is inclined downwardly into the chamber defined within the shield 18. Each cutting edge 38 extends inwardly towards the center of the aperture 34 in a clockwise direction from a leading end to a trailing end 40. At this position, the cutting edge 38 forms a junction with a substantially radially extending edge which forms one side of a slot 42 separating the adjacent teeth 36.

Figure 3:
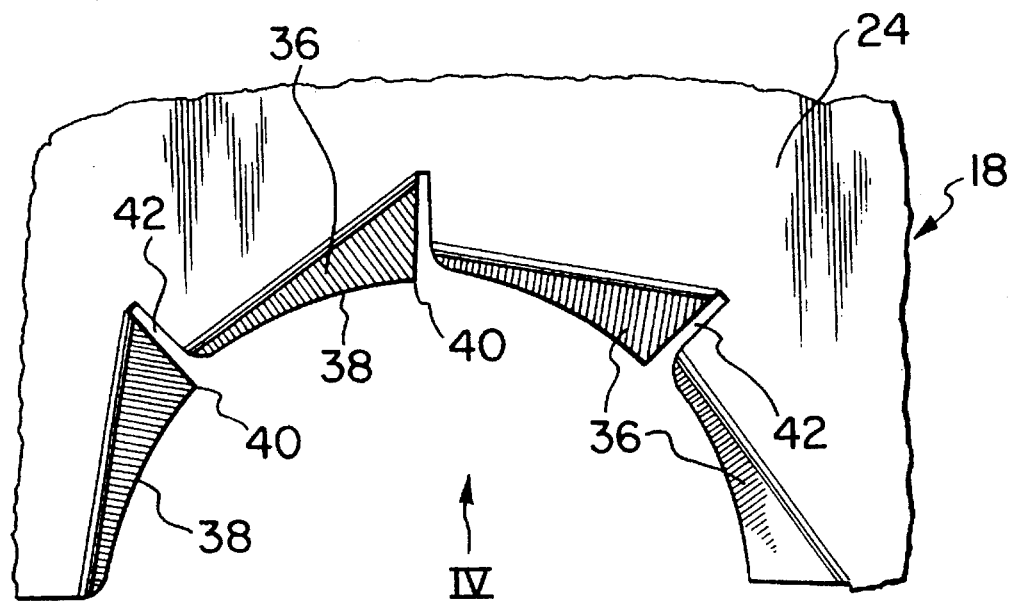
FIG. 3 is a plan view of part of an electromagnetic radiation interference shield of the device.
Figure 4:
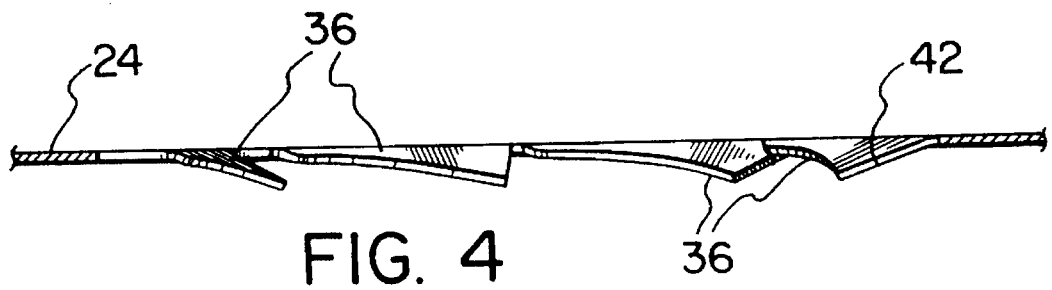
FIG. 4 is a view on the part of the shield in FIG. 3 taken in the direction of arrow IV in FIG. 3.

The device 10 also includes a heat sink 44. As shown by FIGS. 5 and 6, the heat sink 44, formed appropriately of conventional heat conducting metal for the purpose, comprises a center body 46 having a plurality, namely three, surrounding heat exchange fins 48 extending from the body in positions axially spaced along the body. The body 46 is shown as cylindrical with the fins being annular at constant outside radius. Such, however, need not be the case as the body and fins may be of any desired cross-sectional shape. One end of the body 46 terminates in a larger end region 50 extending into a still larger diameter flange 52 connected to the body 46. As will become clear, the end region 50 is necessarily cylindrical and the diameter of the end region 50 is slightly greater than the diameter at the leading cutting end 40 of the teeth 36 with the teeth in their lower inclined position as shown in FIGS. 3 and 4.

To assemble the shield and heat sink onto the printed circuit board, the shield is positioned upon the board and securely soldered in place with ground contact made with the layer 30 upon the board. At this time the component 14 is not completely shielded from EMI problems because of the aperture 34 which exists in the shield. However, the heat sink 44 is placed with its lower end region 50 into the hole 34 which immediately removes the EMI leakage through the aperture. The heat sink is pushed downwardly into the aperture 34 and during this process the ends 40 of the cutting edges 38 cut axial grooves extending up the end region 50. Movement of the heat sink into the aperture 34 terminates upon engagement of the end surface of the end region 50 with the upper surface of the electronic component 14. In this position (FIG. 5) the heat sink cannot positively contact the electronic component with sufficient force to provide efficient heat conduction away from the component. To provide this force, the heat sink 44 is rotated within the aperture 34 in an appropriate direction to cause the teeth 36 to dig into the end region 50 while creating a spiral cut into the end region towards the flange 52. This rotation of the heat sink 44 accompanied by the spiral cutting action effectively results in movement of the teeth themselves towards the flange 52 by a flexing action upon the top wall 24, because the heat sink 44 is prevented by the component 14 from actually moving in the opposite direction. The effect of such an action is that the teeth 36 tend to move towards the plane of the top wall 24 and cause a complicated resilient flexure of the shield 18 particularly at the U-bends 22. The top wall 24 thus attempts to force the teeth 36 downwardly towards the component 14. FIG. 6 shows the finished position of the heat sink 44 after the flexing action. In this position, the top wall 24 engages the flange 52 which prevents any additional downward load on the end region 50. As may be seen by comparison of FIGS. 5 and 6, the upward movement of the teeth 36 is accommodated mainly by a resilient flexure of the U-bends 22 which act as arcuate spring regions as they are resiliently deformed towards a shallow condition (FIG. 6) from a deeper condition shown in FIG. 5. Some flexure of the walls 20 in an outward direction may also occur. A result of this resilient movement is that the teeth 36 impose a continuous axial load upon the end region 50 so as to hold the heat sink 44 downwardly with continuous pressure upon the top surface of the component 14. This pressure is insufficient to physically damage the component 14, but is sufficient to hold the heat sink in permanent heat exchange heat conducting engagement with the top surface of the component.

As may be seen, therefore, from the above embodiment, the combination of the heat sink 44 and the shield 18 provides efficient heat exchange and EMI shielding to the component 14. The EMI shielding is mainly created by the shield 18 itself, but with the aperture 34 occupied by the heat sink 44, the heat sink also provides some measure of EMI shielding. Because of the manner of attachment of the heat sink to the shield 18, a gas-tight seal is provided between each of the teeth and the end region 50 so that electrical conducting contact between the heat sink and the shield 18 is assured. The grounding for the shield 18 to operate as an EMI shield is also effective as a grounding therefore for the heat sink. In addition to this, the shield 18 while operating in its shielding capacity also provides the extra function of being the element which holds the heat sink in position in heat conducting contact with the component 14. As a result, the heat sink 44 and the shield 18 both act in ways other than their normal function, i.e. as a shield and as a heat sink and together ensure the total EMI shielding and heat conduction from the component 14. EMI shielding is thus effective while the heat conducting relationship from component to heat sink is also assured.

What is claimed is:

1. An electronic device comprising an electronic component carried upon one side of a substrate, and an electromagnetic radiation interference shield and heat sink assembly comprising:

a resilient electromagnetic radiation interference shield extending around the electronic component on the one side of the substrate the shield formed with an aperture and housing a plurality of cutting teeth extending into the aperture and inclined in the same direction relative to an axis of the aperture; and a heat sink extending outwards from the shield and passing through the aperture defined in the shield and into heat conductive relationship with the component with the heat sink occupying the aperture to operate also in an electromagnetic radiation shielding capacity;

the shield supporting the heat sink with the cutting teeth biting into the heat sink and resiliently deflected by the heat sink to provide electrically conductive contact with the shield and cause the shield to be resiliently stressed to resiliently urge the heat sink positively into heat conducting relationship with the component.

2. An electronic device according to claim 1 wherein the shield comprises a housing having wall means having free ends defining an opening into an interior of the shield for locating the component, and an end wall opposite the opening, the end wall defining the aperture and provided with the teeth, the end wall merging with the wall means at arcuate spring regions which deform to permit resilient movement of the teeth outwards from the component.

3. An electronic device according to claim 2 wherein the heat sink has a cylindrical body extending outwards from the shield, the cylindrical body outwardly from the shield formed with a plurality of heat exchange fins in spaced positions along the body and extending around the body.

4. An electronic device according to claim 1 wherein the heat sink has an abutment surface for engagement by the shield when resiliently stressed to limit the load applied by the heat sink against the electronic component.

5. An electronic device according to claim 2 wherein the arcuate spring regions are U-shaped.

6. A heat sink and electromagnetic radiation interference shield combination for an electronic component mounted upon a substrate, the shield comprising a resilient electrically conductive housing having means for securing the shield to the substrate, the housing defining an inner space means for containing the component and formed with a generally circular aperture and a plurality of resilient cutting teeth disposed around and facing into the aperture, the cutting teeth having cutting edges inclined axially of the aperture;

and the heat sink having a cylindrical end region received in an axial direction through the aperture in interference with the inclined cutting edges of the teeth so as to engage an end surface of the end region with the component, the heat sink being rotated within the aperture thereby causing the teeth to cut into the cylindrical end region thereby effecting resilient outwards movement of the teeth away from the component and to hold the heat sink abutted in heat conductive engagement against the component.

7. A combination according to claim 6 wherein the heat sink has a cylindrical body extending from the end region, the cylindrical body formed with a plurality of heat exchange fins in spaced position along the body and extending around the body.

8. A combination according to claim 7 wherein each of the heat exchange fins extends as an annulus around the body.

* * * * *